US006380108B1

(12) United States Patent
Linthicum et al.

(10) Patent No.: US 6,380,108 B1
(45) Date of Patent: Apr. 30, 2002

(54) PENDEOEPITAXIAL METHODS OF FABRICATING GALLIUM NITRIDE SEMICONDUCTOR LAYERS ON WEAK POSTS, AND GALLIUM NITRIDE SEMICONDUCTOR STRUCTURES FABRICATED THEREBY

(75) Inventors: Kevin J. Linthicum, Angier; Thomas Gehrke, Carrboro; Robert F. Davis, Raleigh, all of NC (US)

(73) Assignee: North Carolina State University, Raleigh, NC (US)

(*) Notice: Subject to any disclaimer, the term of this patent is extended or adjusted under 35 U.S.C. 154(b) by 0 days.

(21) Appl. No.: 09/468,995

(22) Filed: Dec. 21, 1999

(51) Int. Cl.[7] .............................................. H01L 21/469
(52) U.S. Cl. ...................................... 438/791; 257/103
(58) Field of Search ................................. 438/503, 478, 438/462, 483, 481, 46, 791; 257/103, 96, 190, 615, 76, 77, 201, 86, 631; 117/95, 96, 952, 105, 108

(56) References Cited

U.S. PATENT DOCUMENTS

| | | | |
|---|---|---|---|
| 4,127,792 A | 11/1978 | Nakata | 313/500 |
| 4,522,661 A | 6/1985 | Morrison et al. | 148/33.2 |
| 4,651,407 A | 3/1987 | Bencuya | 29/571 |

(List continued on next page.)

FOREIGN PATENT DOCUMENTS

| | | |
|---|---|---|
| CA | 2258080 | 10/1998 |
| EP | 0 551 721 A2 | 7/1993 |
| EP | 0 852 416 A1 | 7/1998 |

(List continued on next page.)

OTHER PUBLICATIONS

Leo Unmasked by Pendeo–Epitaxy, Compound Semiconductor, Mar. 1999, p 16.

International Search Report, PCT/US00/40724, Feb. 27, 2001.

Zeng et al., Optical Properties of GaN Pyramids, Applied Physics Letters, vol. 74, No. 9, Mar. 1, 1999, pp. 1227–1229.

(List continued on next page.)

*Primary Examiner*—David Nelms
*Assistant Examiner*—David Vu
(74) *Attorney, Agent, or Firm*—Myers, Bigel, Sibley & Sajovec

(57) ABSTRACT

A gallium nitride layer is pendeoepitaxially grown on weak posts on a substrate that are configured to crack due to a thermal expansion coefficient mismatch between the substrate and the gallium nitride layer on the weak posts. Thus, upon cooling, at least some of the weak posts crack, to thereby relieve stress in the gallium nitride semiconductor layer. Accordingly, low defect density gallium nitride semiconductor layers may be produced. Moreover, the weak posts can allow relatively easy separation of the substrate from the gallium nitride semiconductor layer to provide a freestanding gallium nitride layer. The weak posts may be formed by forming an array of posts in spaced apart staggered relation on the substrate. By staggering the posts, later fracturing may be promoted compared to long unstaggered posts. Alternatively, the posts may have a height to width ratio in excess of 0.5, so that the relatively narrow posts promote cracking upon reduction of the temperature. In another alternative, the posts preferably are less than one micron wide, more preferably less than one half micron wide, regardless of height, to promote cracking. In yet another alternative, a post weakening region is formed in the posts, adjacent the substrate. In particular, a buried region may be formed in the substrate and the substrate then may be selectively etched to define the plurality of weak posts including the post weakening regions that comprise the buried region. The buried region may comprise implanted ions, preferably hydrogen ions, that can form hydrogen bubbles within the posts that can fracture the posts upon cooling.

85 Claims, 5 Drawing Sheets

U.S. PATENT DOCUMENTS

| | | | |
|---|---|---|---|
| 4,865,685 A | 9/1989 | Palmour | 156/643 |
| 4,876,210 A | 10/1989 | Barnett et al. | 437/5 |
| 4,912,064 A | 3/1990 | Kong et al. | 437/100 |
| 4,946,547 A | 8/1990 | Palmour et al. | 156/643 |
| 5,122,845 A | 6/1992 | Manabe et al. | 357/17 |
| 5,156,995 A | 10/1992 | Fitzgerald, Jr. et al. | 437/90 |
| RE34,861 E | 2/1995 | Davis et al. | 437/100 |
| 5,389,571 A | 2/1995 | Takeuchi et al. | 437/133 |
| 5,397,736 A | 3/1995 | Bauser et al. | 437/92 |
| 5,549,747 A | 8/1996 | Bozler et al. | 117/43 |
| 5,710,057 A | 1/1998 | Kenney | 437/62 |
| 5,760,426 A | 6/1998 | Marx et al. | 257/190 |
| 5,786,606 A | 7/1998 | Nishio et al. | 257/103 |
| 5,815,520 A | 9/1998 | Furushima | 372/45 |
| 5,877,070 A | 3/1999 | Goesele et al. | 438/458 |
| 5,880,485 A | 3/1999 | Marx et al. | 257/94 |
| 5,912,477 A | 6/1999 | Negley | 257/95 |
| 5,919,305 A * | 7/1999 | Solomon | 117/90 |
| 6,051,849 A | 4/2000 | Davis et al. | 257/103 |
| 6,064,078 A | 5/2000 | Northrup et al. | 257/96 |
| 6,100,104 A | 8/2000 | Haerle | 438/33 |
| 6,100,111 A | 8/2000 | Konstantinov | 438/92 |
| 6,113,685 A * | 9/2000 | Wang et al. | 117/3 |
| 6,121,121 A * | 9/2000 | Koide | 438/481 |
| 6,153,010 A | 11/2000 | Kiyoku et al. | 117/95 |
| 6,156,584 A | 12/2000 | Itoh et al. | 438/33 |
| 6,177,292 B1 | 1/2001 | Hong et al. | |
| 6,303,405 B1 * | 10/2001 | Yoshida et al. | 438/46 |

FOREIGN PATENT DOCUMENTS

| | | |
|---|---|---|
| EP | 0 884 767 A2 | 12/1998 |
| EP | 0 942 459 A1 | 9/1999 |
| EP | 0 951 055 A2 | 10/1999 |
| JP | 3-132016 | 6/1991 |
| JP | 4-188678 | 7/1992 |
| JP | 5-7016 | 1/1993 |
| JP | 5-41536 | 2/1993 |
| JP | 8-18159 | 1/1996 |
| JP | 08-064791 | 3/1996 |
| JP | 8-116093 | 5/1996 |
| JP | 8-125251 | 5/1996 |
| JP | 8-153931 | 6/1996 |
| JP | 9-93315 | 4/1997 |
| JP | 9-174494 | 6/1997 |
| JP | 9-181071 | 7/1997 |
| JP | 9-201477 | 7/1997 |
| JP | 9-277448 | 10/1997 |
| JP | 9-290098 | 10/1997 |
| JP | 9-324997 | 11/1997 |
| JP | 11-145516 | 5/1999 |
| WO | WO 97/11518 | 3/1997 |
| WO | WO 98/47170 | 10/1998 |
| WO | WO 99/01594 A1 | 1/1999 |
| WO | WO 99/18617 | 4/1999 |
| WO | WO 99/44224 | 9/1999 |
| WO | WO 99/65068 A1 | 12/1999 |

OTHER PUBLICATIONS

Honda et al., Selective Area Growth of GaN Microstructures on Patterned (111) and (001) Si Substrates, 4$^{th}$ European Workshop on GaN, Nottingham, UK, Jul. 2–5, 2000.

Gehrke et al., Pendeo–Epitaxial Growth of Gallium Nitride on Silicon Substrates, Journal of Electronic Materials, vol. 29, No. 3, Mar. 2000, pp. 306–310.

Gehrke et al., Pendeo–Epitaxy of Gallium Nitride and Aluminum Nitride Films and Heterostructures on Silicon Carbide Substrates, MRS Internet J. Semicond. Res. 4S1, G3.2, 1999, 6 pp.

Thomson et al., Ranges of Deposition Temperatures Applicable for Metalorganic Vapor Phase Epitaxy of GaN Films Via the Technique of Pendeo–Epitaxy, MRS Internet J. Semicond. Res. 4S1, G3.37, 1999, 6 pp.

Linthicum et al., Pendeoepitaxy of Gallium Nitride Thin Films, Applied Physics Letters, vol. 75, No. 2, Jul. 12, 1999, pp. 196–198.

Zheleva et al., Pendeo–Epitaxy: A New Approach for Lateral Growth of Gallium Nitride Films, Journal of Electronic Materials, vol. 28, No. 4, Feb. 1999, pp. L5–L8.

Zheleva et al., Pendeo–Epitaxy–A New Approach for Lateral Growth of GaN Structures, MRS Internet Journal of Nitride Semiconductor Research, 1999, Online!, vol. 4S1, No. G3.38, Nov. 30, 1998–Dec. 4, 1998.

U.S. application No. 60/109,674, Linthicum et al., filed Nov. 24, 1998.

U.S. application No. 60/109,860, Gehrke et al., filed Nov. 24, 1998.

Nakamura et al., InGaN/GaN/AlGaN–Based Laser Diodes Grown on GaN Substrates With a Fundamental Transverse Mode, Jpn. J. Appl. Phys., vol. 37, No. 6, Sep. 15, 1998, pp. L1020–L1022.

Marchand et al., Microstructure of GaN Laterally Overgrown by Metalorganic Chemical Vapor Deposition, Applied Physics Letters, vol. 73, No. 6, Aug. 10, 1998, pp. 747–749.

Sakai et al., Transmission Electron Microscopy of Defects in GaN Films Formed by Epitaxial Lateral Overgrowth, vol. 73, No. 4, Jul. 27, 1998, pp. 481–483.

Nakamura et al., High–Power, Long–Lifetime InGaN/GaN/AlGaN–Based Laser Diodes Grown on Pure GaN Substrates, Jpn. J. Appl. Phys., vol. 37, Mar. 15, 1998, pp. L309–L312.

Nam et al., Lateral Epitaxial Overgrowth of GaN Films on SiO$_2$ Areas Via Metalorganic Vapor Phase Epitaxy, Journal of Electronic Materials, vol. 27, No. 4, 1998, pp. 233–237.

Wu et al., Growth and Characterization of SiC Films on Large–Area Si Wafers by APCVD–Temperature Dependence, Materials Science Forum, vols. 264–268, 1998, pp. 179–182.

Nakamura et al., InGaN/GaN/AlGaN–Based Laser Diodes With Modulation–Doped Strained–Layer Superlattices, Jpn. J. Appl. Phys., vol. 36, Dec. 1, 1997, pp. L1568–L1571.

Kapolnek et al., "Anisotropic Epitaxial Lateral Growth in GaN Selective Area Epitaxy", Appl. Phys. Lett. 71 (9), Sep. 1, 1997, pp. 1204–1206.

Usui et al., "Thick GaN Epitaxial Growth With Low Dislocation Density by Hydride Vapor Phase Epitaxy", Jpn. J. Appl. Phys., vol. 36, Part 2, No. 7B, Jul. 15, 1997, pp. 899–902.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638–2640.

Zheleva et al., Dislocation Density Reduction Via Lateral Epitaxy in Selectively Grown GaN Structures, Appl. Phys. Lett., vol. 71, No. 17, Oct. 27, 1997, pp. 2472–2474.

Nam, et al., "Growth of GaN and Al$_{0.2}$Ga$_{0.8}$N on Patterned Substrates Via Organometallic Vapor Phase Epitaxy", Jpn. J. Appl. Phys., vol. 36, Part 2, No. 5A, May 1, 1997, pp. 532–535.

Bruel et al., Smart–Cut: A New Silicon on Insulator Material Technology Based on Hydrogen Implantation and Wafer Bonding, Jpn. J. Appl. Phys., vol. 36, Par 1, No. 3B, Mar. 1997, pp. 1636–1641.

Nam et al., "Selective Growth of GaN and $Al_{0.2}Ga_{0.8}N$ on GaN/AlN/6H–SiC(0001) Multilayer Substrates Via Organometallic Vapor Phase Epitaxy", Proceedings MRS, Dec. 1996, 6 pp.

Kapolnek et al., "Selective Area Epitaxy of GaN for Electron Field Emission Devices", Journal of Crystal Growth, 5451, 1996, pp. 1–4.

Weeks et al, "GaN Thin Films Deposited Via Organometallic Vapor Phase Epitaxy on α(6H)–SiC(0001) Using High–Temperature Monocrystalline AlN Buffer Layers", Appl. Phys. Lett. 67 (3), Jul. 17, 1995, pp. 401–403.

Doverspike et al., The Effect of GaN and AlN Buffer Layers on GaN Film Properties Grown on Both C–Plane and A–Plane Sapphire, Journal of Electronic Materials, vol. 24, No. 4, 1995, pp. 269–273.

Kato et al., "Selective Growth of Wurtzite GaN and $Al_xGa_{1-x}N$ on GaN/Sapphire Substrates by Metalorganic Vapor Phase Epitaxy", Journal of Crystal Growth, 144, 1994, pp. 133–140.

Kuznia et al., Influence of Buffer Layers on the Deposition of High Quality Single Crystal GaN Over Sapphire Substrates, J. Appl. Phys., vol. 73, No. 9, May 1, 1993, pp. 4700–4702.

Watanabe et al., The Growth of Single Crystalline GaN on a Si Substrate Using AlN As An Intermediate Layer, Journal of Crystal Growth, vol. 128, 1993, pp. 391–396.

Yamaguchi et al, "Lateral Supply Mechanisms in Selective Metalorganic Chemical Vapor Deposition", Jpn. Appl. Phys., vol. 32 (1993), pp. 1523–1527.

Nakamura, GaN Growth Using GaN Buffer Layer, Japanese Journal of Applied Physics, vol. 30, No. 10A, Oct. 1991, pp. L1705–L1707.

Chen et al., Silicon–on–Insulator: Why, How, and When, AIP Conference Proceedings, vol. 167, No. 1, Sep. 15, 1988, pp. 310–319.

Amano et al., Metalorganic Vapor Phase Epitaxial Growth of a High Quality GaN Film Using an AlN Buffer Layer, Applied Physics Letters, vol. 48, No. 5, Feb. 3, 1986, pp. 353–355.

Yoshida et al., Improvements on the Electrical and Luminescent Properties of Reactive Molecular Beam Epitaxially Grown GaN Films by Using AlN–Coated Sapphire Substrates, Applied Physics Letters, vol. 42, No. 5, Mar. 1, 1983, pp. 427–429.

U.S. application Ser. No. 09/031,843, Davis et al., filed Feb. 27, 1998.

U.S. application Ser. No. 09/327,136, Zheleva et al., Jun. 7, 1999.

U.S. application Ser. No. 09/441,754, Linthicum et al., Nov. 17, 1999.

U.S. application Ser. No. 09/198,784, Linthicum et al., Nov. 24, 1998.

U.S. application Ser. No. 60/170,433, Gehrke et al., Dec. 13, 1999.

U.S. application Ser. No. 09/441,753, Gehrke et al., Nov. 17, 1999.

Kim, S., "Production of Gallium Nitride Semiconductor Single Crystal Substrate and Gallium Nitride Diode Produced by Using the Substrate," *Patent Abstracts of Japan*, Pub. No. 11001399, May 12, 1997.

Vaudo, R., et al., "Low Defect Density GaN–Based Substrates Grown by HVPE," *Electrochemical Society Proceedings*, vol. 98–18, Nov. 1, 1998.

Kryliouk et al., "Growth of GaN Single Crystal Substrates," *Materials Science and Engineering*, B59, 6–11, 1999.

International Search Report, PCT/US99/27358, Apr. 28, 2000.

Nakamura, InGaN–Based Violet Laser Diodes, Semicond. Sci. Technol., 14, 1999, pp. R27–R40.

Nakamura et al., Violet InGaN/GaN/AlGaN–Based Laser Diodes Operable at 50° C. With a Fundamental Transverse Mode, Jpn. J. Appl. Phys. vol. 38, Part 1, No. 3A, Mar. 1, 1999, pp. L226–L229.

Boo et al., Growth of Hexagonal GaN Thin Films on Si(111) with Cubic SiC Buffer Layers, Journal of Crystal Growth 189–190, 1998, pp. 183–188.

Linthicum et al., Process Routes for Low–Defect Density GaN on Various Substrates Employing Pendeo–Epitaxial Growth Techniques, MRS Internet Journal of Nitride Semiconductor Research, Fall Meeting of the Materials Research Society, vol. 4S1, No. G4.9, Nov. 30, 1998–Dec. 4, 1998.

Steckl et al., SiC Rapid Thermal Corbonization of the (111)Si Semiconductor–on–Insulator Structure and Subsequent Metalorganic Chemical Vapor Deposition, Appl. Phys. Let., 69 (15), Oct. 7, 1996, pp. 2264–2266.

Gallium Nitride–2000–Technology, Status, Applications, and Market Forecasts, Strategies Unlimited, Report SC–23, May 2000.

Chen et al., Dislocation Reducing in GaN Thin Films Via Lateral Overgrowth From Trenches, Applied Physics Letters, vol. 75, No. 14, Oct. 4, 1999, pp. 2062–2063.

Nakamura, InGaN/GaN/AlGaN–Based Laser Diodes, Properties, Processing and Applications of Gallium Nitride and Related Semiconductors, EMIS Datareviews Series No. 23, 1998, pp. 587–595.

Hiramatsu et al., Selective Area Growth and Epitaxial Lateral Overgrowth of GaN, Properties, Processing and Applications of Gallium Nitride and Related Semiconductors, EMIS Datareviews Series No. 23, 1998, pp. 440–446.

Sakai, Defect Structure in Selectively Grown GaN Films With Low Threading Dislocation Density, Appl. Phys. Lett., vol. 71, No. 16, Oct. 20, 1997, pp. 2259–2261.

Gustafsson et al., Investigations of High Quality $Ge_xSi_{1-x}$ Grown by Heteroepitaxial Lateral Overgrowth Using Cathoduluminescence, Inst. Phys. Conf. Ser. No. 134: Section 11, Micros. Semicond. Mater. Conf., Oxford, Apr. 5–8, 1993, pp. 675–678.

Givargizov, Other Approaches to Oriented Crystallization on Amorphous Substrates, Chapter 4, Oriented Crystallization on Amorphous Substrates, Plenum Press, 1991, pp. 221–264.

Akasaki et al., Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE, Journal of Crystal Growth, vol. 98, 1989, pp. 209–219.

Ujiie et al., Epitaxial Lateral Overgrowth of GaAs on a Si Substrate, Jpn. J. Appl. Phys., vol. 28, 1989, p. L337–L339.

Ishiwara et al., Lateral Solid Phase Epitaxy of Amorphous Si Films on Si Substrates With $SiO_2$ Patterns, Applied Physics Letters, vol. 43, No. 11, Dec. 1, 1983, pp. 1028–1030.

Jastrzebski, SOI by CVD: Epitaxial Lateral Overgrowth (ELO) Process–Review, Journal of Crystal Growth, vol. 63, 1983, pp. 493–526.

Rathman et al., Lateral Epitaxial Overgrowth of Silicon on $SiO_2$, Journal of the Electrochemical Society, Oct. 1982, pp. 2303–2306.

Shaw, Selective Epitaxial Deposition of Gallium Arsenide in Holes, Journal of the Electrochemical Society, Sep. 1966, pp. 904–908.

Tausch, Jr. et al., A Novel Crystal Growth Phenomenon: Single Crystal GaAs Overgrowth Onto Silicon Dioxide, Journal of the Electrochemical Society, Jul. 1965, pp. 706–709.

Joyce et al., Selective Epitaxial Deposition of Silicon, Nature, vol. 4840, Aug. 4, 1962, pp. 485–486.

* cited by examiner

PENDEOEPITAXIAL METHODS OF FABRICATING GALLIUM NITRIDE SEMICONDUCTOR LAYERS ON WEAK POSTS, AND GALLIUM NITRIDE SEMICONDUCTOR STRUCTURES FABRICATED THEREBY

FEDERALLY SPONSORED RESEARCH

This invention was made with Government support under Office of Naval Research Contract Nos. N00014-96-1-0765, N00014-98-1-0384, and N00014-98-1-0654. The Government may have certain rights to this invention.

FIELD OF THE INVENTION

This invention relates to microelectronic devices and fabrication methods, and more particularly to gallium nitride semiconductor devices and fabrication methods therefor.

BACKGROUND OF THE INVENTION

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable.

It also is known to produce low defect density gallium nitride layers by forming a mask on a layer of gallium nitride, the mask including at least one opening therein that exposes the underlying layer of gallium nitride, and laterally growing the underlying layer of gallium nitride through the at least one opening and onto the mask. This technique often is referred to as "Epitaxial Lateral Overgrowth" (ELO). The layer of gallium nitride may be laterally grown until the gallium nitride coalesces on the mask to form a single layer on the mask. In order to form a continuous layer of gallium nitride with relatively low defect density, a second mask may be formed on the laterally overgrown gallium nitride layer, that includes at least one opening that is offset from the opening in the underlying mask. ELO then again is performed through the openings in the second mask to thereby overgrow a second low defect density continuous gallium nitride layer. Microelectronic devices then may be formed in this second overgrown layer. ELO of gallium nitride is described, for example, in the publications entitled *Lateral Epitaxy of Low Defect Density GaN Layers Via Organometallic Vapor Phase Epitaxy* to Nam et al., Appl. Phys. Lett. Vol. 71, No. 18, Nov. 3, 1997, pp. 2638–2640; and *Dislocation Density Reduction Via Lateral Epitaxy in Selectively Grown GaN Structures* to Zheleva et al, Appl. Phys. Lett., Vol. 71, No. 17, Oct. 27, 1997, pp. 2472–2474, the disclosures of which are hereby incorporated herein by reference.

It also is known to produce a layer of gallium nitride with low defect density by forming at least one trench or post in an underlying layer of gallium nitride to define at least one sidewall therein. A layer of gallium nitride is then laterally grown from the at least one sidewall. Lateral growth preferably takes place until the laterally grown layers coalesce within the trenches. Lateral growth also preferably continues until the gallium nitride layer that is grown from the sidewalls laterally overgrows onto the tops of the posts. In order to facilitate lateral growth and produce nucleation of gallium nitride and growth in the vertical direction, the top of the posts and/or the trench floors may be masked. Lateral growth from the sidewalls of trenches and/or posts also is referred to as "pendeoepitaxy" and is described, for example, in publications entitled *Pendeo-Epitaxy: A New Approach for Lateral Growth of Gallium Nitride Films* by Zheleva et al., Journal of Electronic Materials, Vol. 28, No. 4, February 1999, pp. L5–L8; and *Pendeoepitaxy of Gallium Nitride Thin Films* by Linthicum et al., Applied Physics Letters, Vol. 75, No. 2, July 1999, pp. 196–198, the disclosures of which are hereby incorporated herein by reference.

Pendeoepitaxy can provide relatively large, low defect gallium nitride layers for microelectronic applications. Unfortunately, it has been found that pendeoepitaxially fabricated gallium nitride layers can have low defect densities during fabrication, but can exhibit cracks and other defects after fabrication. In particular, since the pendeoepitaxial layer generally is formed on a non-gallium nitride substrate, stress may occur in the pendeoepitaxial layer due to thermal expansion coefficient mismatch between the substrate and the pendeoepitaxial gallium nitride layer as the temperature is reduced from the elevated growth temperature to room temperature. This stress due to thermal expansion coefficient mismatch may create cracks and/or other defects in the gallium nitride semiconductor layer, which can greatly reduce the suitability thereof for microelectronic device applications.

Moreover, since the pendeoepitaxial gallium nitride layer is formed on a substrate, it may be difficult to provide a freestanding gallium nitride semiconductor layer that can be used as a large area seed for further gallium nitride bulk growth. The substrate can be removed to provide a freestanding gallium nitride semiconductor layer, but substrate removal may be difficult using conventional techniques, without damaging the gallium nitride semiconductor layer.

Accordingly, notwithstanding the recent advances of pendeoepitaxy, there continues to be a need for methods of fabricating gallium nitride semiconductor layers having low defect densities at room temperature and for fabricating freestanding gallium nitride semiconductor layers.

SUMMARY OF THE INVENTION

The present invention pendeoepitaxially grows a gallium nitride layer on weak posts on a substrate that are configured to crack due to a thermal expansion coefficient mismatch between the substrate and the gallium nitride layer on the weak posts. Thus, upon cooling, at least some of the weak posts crack, to thereby relieve stress in the gallium nitride semiconductor layer. Accordingly, low defect density gallium nitride semiconductor layers may be produced. Moreover, the weak posts can allow relatively easy separation of the substrate from the gallium nitride semiconductor layer to provide a freestanding gallium nitride layer.

More specifically, gallium nitride semiconductor layers may be fabricated by forming a plurality of weak posts on a substrate. The weak posts define a plurality of sidewalls and are configured to crack due to a thermal expansion coefficient mismatch between the substrate and the later formed gallium nitride semiconductor layer on the weak posts. A gallium nitride layer is grown from the sidewalls of the weak posts at elevated temperature, until the gallium nitride layer coalesces to produce a gallium nitride semiconductor layer. The gallium nitride layer preferably is grown using pendeoepitaxy so that the gallium nitride layer is cantilevered from the substrate. At least some of the weak posts then are cracked due to the thermal expansion coefficient mismatch between the substrate and the gallium nitride semiconductor layer upon reducing the elevated temperature. Stress in the gallium nitride semiconductor layer thereby can be relieved.

The weak posts may be formed by forming an array of posts in spaced apart staggered relation on the substrate. By staggering the posts, later fracturing may be promoted compared to long unstaggered posts. Alternatively, the posts may have a height to width ratio in excess of 0.5, so that the relatively narrow posts promote cracking upon reduction of the temperature. In another alternative, the posts preferably are less than one micron wide, more preferably less than one half micron wide, regardless of height, to promote cracking. In yet another alternative, a post weakening region is formed in the posts, adjacent the substrate. In particular, a buried region may be formed in the substrate and the substrate then may be selectively etched to define the plurality of weak posts including the post weakening regions that comprise the buried region. The buried region may comprise implanted ions, preferably hydrogen ions, that can agglomerate to form hydrogen bubbles within the posts that can fracture the posts upon cooling. It will be understood that each of the above-described techniques of staggered posts, narrow posts and post weakening regions may be used separately or in combination to produce weak posts on a substrate according to the present invention.

At least some of the weak posts crack due to the thermal expansion coefficient mismatch between the substrate and the gallium nitride semiconductor layer upon reducing the elevated temperature, to thereby relieve stress in the gallium nitride semiconductor layer. Thus, the pendeoepitaxial substrates act as an engineered weak platform. Instead of cracks occurring throughout the gallium nitride semiconductor layer, the cracks preferably occur at the posts and may actually shear some of the posts, leaving the gallium nitride semiconductor layer intact. Moreover, all of the weak posts may crack and/or shear, to thereby separate the gallium nitride semiconductor layer from the substrate and produce a freestanding gallium nitride semiconductor layer. Alternatively, the weak posts may facilitate the separation of the gallium nitride semiconductor layer from the substrate at the weakened posts, to produce a freestanding gallium nitride semiconductor layer. The freestanding gallium nitride semiconductor layer then may act as a large area seed for subsequent epitaxial growth of a gallium nitride layer on the freestanding gallium nitride semiconductor layer.

Gallium nitride semiconductor structures according to the present invention include a substrate, a plurality of posts on the substrate that include a plurality of sidewalls, and a gallium nitride semiconductor layer extending between the sidewalls of adjacent posts. At least one of the posts is cracked between the substrate and the gallium nitride layer. The plurality of posts may be in spaced apart staggered relation on the substrate. The plurality of posts may have a height to width ratio in excess of 0.5. The plurality of posts may be less than one micron and more preferably less than one half micron wide. The plurality of posts may include a post weakening region therein adjacent the substrate that contains bubbles, preferably hydrogen bubbles, therein.

Moreover, the present invention may provide a freestanding monocrystalline gallium nitride substrate having first and second opposing faces each having an area greater than 0.25 cm$^2$ and having a defect density of less than $10^5$ cm$^{-2}$. The structures may include at least one post extending from one of the faces, wherein the post is jagged. An array of spaced apart staggered posts, bubble posts and/or posts that are less than one half micron wide, may be provided. An epitaxial gallium nitride layer also may be provided on one of the first and second opposing faces of the freestanding gallium nitride layer. Accordingly, gallium nitride semiconductor layers that can exhibit reduced susceptibility to cracking after fabrication and relatively large area freestanding gallium nitride layers may be provided.

DETAILED DESCRIPTION OF PREFERRED EMBODIMENTS

Figure 1:
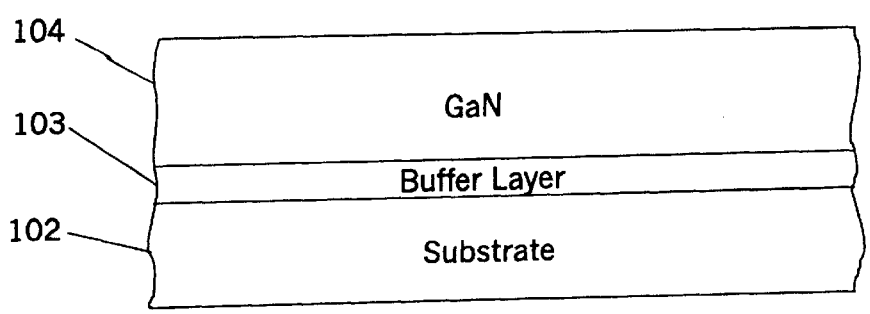
FIGS. 1–6 are cross-sectional views of gallium nitride semiconductor structures during intermediate fabrication steps, according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. Moreover, each embodiment described and illustrated herein includes its complementary conductivity type embodiment as well.

Referring now to FIGS. 1–6, methods of fabricating gallium nitride semiconductor structures according to embodiments of the present invention now will be described. As shown in FIG. 1, an underlying gallium nitride layer 104 is grown on a substrate 102 using an optional intermediate buffer layer 103. The substrate may be silicon carbide. Alternatively, the substrate may be a silicon substrate, for example as described in Application Ser. No. 09/441,754 entitled *Methods of Fabricating Gallium Nitride Microelectronic Layers on Silicon Layers and Gallium Nitride Microelectronic Structures Formed Thereby* to Linthicum et al., filed Nov. 17, 1999, assigned to the assignee of the present application, the disclosure of which is hereby incorporated herein by reference. In another alternative, the substrate may be sapphire, for example as described in Application Ser. No. 09/441,753 entitled *Pendeoepitaxial Methods of Fabricating Gallium Nitride Semiconductor Layers on Sapphire Substrates, and Gallium Nitride Semiconductor Structures Fabricated Thereby* to Gehrke et al, filed Nov. 17, 1999, assigned to the assignee of the present application, the disclosure of which is hereby incorporated herein by reference in its entirety. Other substrates also may be used. As described in the above-cited applications, the buffer layer 103 may comprise aluminum nitride, gallium nitride and/or other materials. The fabrication of an underlying gallium nitride layer 104 on a substrate 102 using an optional buffer layer 103 is well known to those having skill in the art and need not be described in detail herein.

Figure 2:
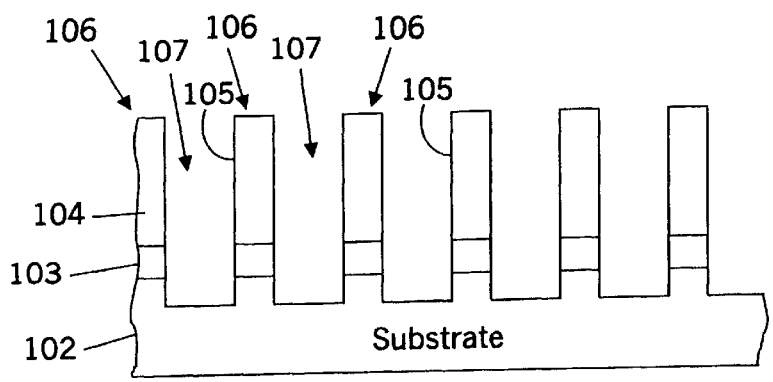

Referring now to FIG. 2, the underlying gallium nitride layer 104 and optionally the buffer layer 103 and also optionally part of the substrate 102 are etched to produce a plurality of posts 106 that define a plurality of trenches 107 therebetween. The alternating posts 106 and trenches 107 define a plurality of sidewalls 105 in the posts. The spaced apart posts 106 also may be referred to as "mesas", "pedestals" or "columns". The trenches also may be referred to as "wells". It will be understood that the posts 106 and the trenches 107 that define the sidewalls 105 may be fabricated by selective etching, selective epitaxial growth and/or other conventional techniques. Moreover, it also will be understood that the sidewalls need not be orthogonal to the substrate 102, but rather may be oblique thereto. Finally, it also will be understood that although the sidewalls 105 are shown in cross-section in FIG. 1, the posts 106 and trenches 107 may define elongated regions that are straight, V-shaped or have other shapes.

The posts 106 are fabricated as "weak" posts. The weak posts are configured to crack due to a thermal coefficient mismatch between the substrate 102 and a later formed gallium nitride semiconductor layer on the weak posts. FIG. 2 illustrates the control of the dimensions of the posts to provide the weak posts. In one embodiment, the height to width ratio of the posts 106 exceeds 0.5. In another embodiment, the posts may be of any arbitrary height, but are less than a predetermined width, preferably less than 1 μm, more preferably less than 0.5 μm, and most preferably less than 0.25 μm. In yet another embodiment, width and thickness (into the plane of FIG. 2) of the posts are 0.25 μm or less and 1.0 μm or less, respectively. These narrow posts may be fabricated using electron beam photolithography or other lithography techniques.

Figure 3:
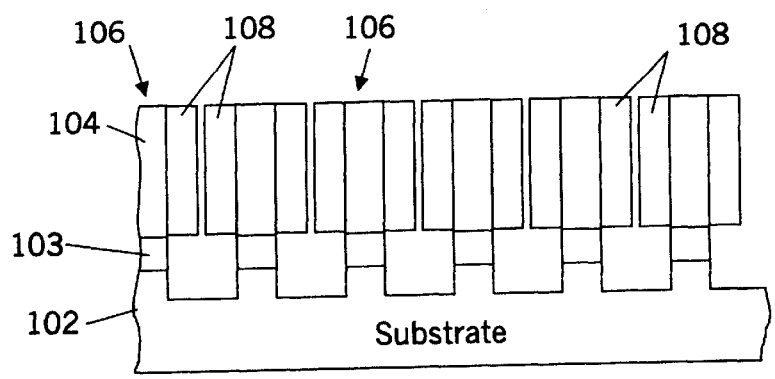

Referring now to FIG. 3, a gallium nitride layer 108 is grown at elevated temperature from the sidewalls 105 of the weak posts 106. As shown in FIG. 3, the gallium nitride layer 108 preferably is spaced apart from or cantilevered from the floor of the trenches 107 to provide pendeoepitaxial growth.

Figure 4:
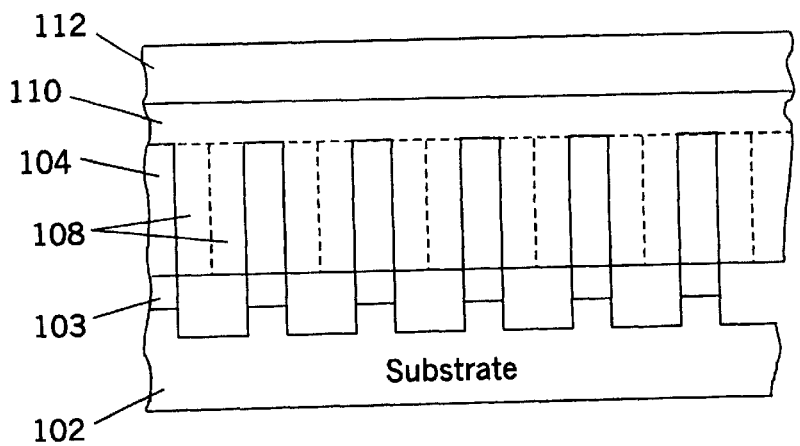

As shown in FIG. 4, growth of the gallium nitride layer 108 from the sidewalls 105 preferably continues until the gallium nitride layer 108 coalesces to produce a gallium nitride semiconductor layer 110. As also shown in FIG. 4, growth may continue onto the tops of the weak posts 106. Pendeoepitaxial growth of gallium nitride from sidewalls is described in detail in the above-cited patent applications and publications, and need not be described in detail herein. However, it should be noted that even though the underlying gallium nitride layer may have a defect density of $10^8$ cm$^{-2}$ or more, the gallium nitride semiconductor layer 110 may have a defect density of $10^5$ cm$^{-2}$ or less. Accordingly, a high quality gallium nitride semiconductor layer 110 may be provided.

As also shown in FIG. 4, a first epitaxial gallium nitride layer 112 may be formed on the gallium nitride semiconductor layer. Since the gallium nitride semiconductor layer 110 provides a large area, for example 0.25 cm$^2$ or more, growth platform having low defect density, the first epitaxial gallium nitride layer 112 may be grown using Hydride Vapor Phase Epitaxy (HVPE) at relatively high rates. The first epitaxial gallium nitride layer 112 preferably is grown to a thickness of at least 30 μm, to provide mechanical stability for a freestanding gallium nitride structure. Growth of the gallium nitride semiconductor layer 110 and the first epitaxial gallium nitride layer 112 preferably takes place at elevated temperature, for example at 1000° C. or more.

Figure 5:
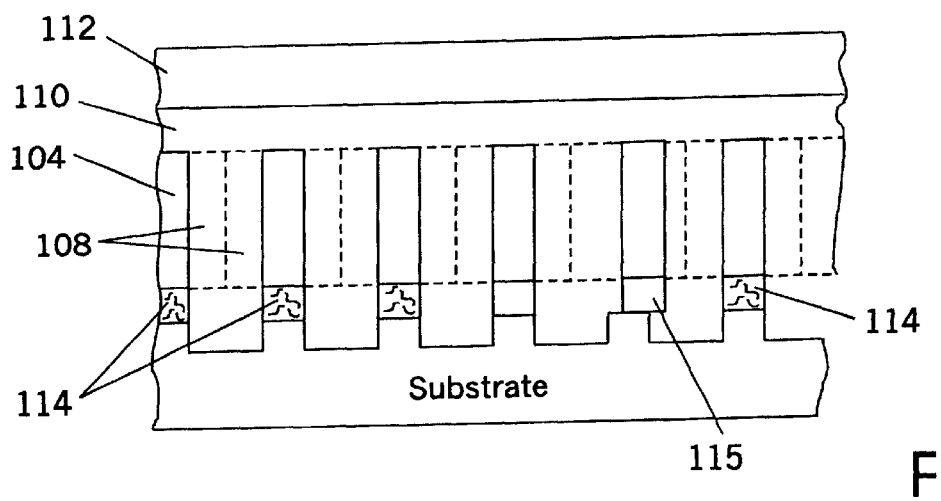

Then, referring to FIG. 5, the elevated growth temperature is decreased, preferably to room temperature, for example by reducing the heater temperature for the growth chamber, using forced cooling and/or removing the structure from the growth chamber. Preferably, cooling from 1000° C. to room temperature takes place over at least 35 minutes, more preferably over at least 15 minutes. As shown in FIG. 5, upon reduction of the temperature, at least some of the weak posts crack, as shown by cracks 114 therein. For example, at least 25%, and more preferably at least 50% of the weak posts crack. These cracks thereby relieve stress that is caused by the thermal expansion coefficient mismatch between the substrate 102 and the gallium nitride semiconductor layer 110 on the weak posts 106. As shown in FIG. 5, the cracks 114 may appear in some or all of the weak posts. In fact, some or all of the weak posts actually may shear as shown at 115 in FIG. 5. The weak posts preferably crack and/or shear between the gallium nitride layer 108 and the substrate 102. However, the actual location where the weak posts crack or shear may depend upon the dimensions and/or compositions of the weak posts and/or other factors. Thus, although the weak posts are shown as cracking in the buffer layer 103, they also or alternatively may crack in the substrate portions of the weak posts or in the gallium nitride portions of the weak posts.

Thus, upon cooling, the weak posts relieve the stress that stems from thermal expansion coefficient mismatch. Accordingly, instead of cracks occurring throughout gallium nitride semiconductor layer 110, the cracks 114 occur in the weak posts and may actually produce shear 115 in some of the weak posts. The gallium nitride semiconductor layer and/or first gallium nitride epitaxial layer 112 therefore can remain crack-free and viable for fabrication of microelectronic devices.

Figure 6:
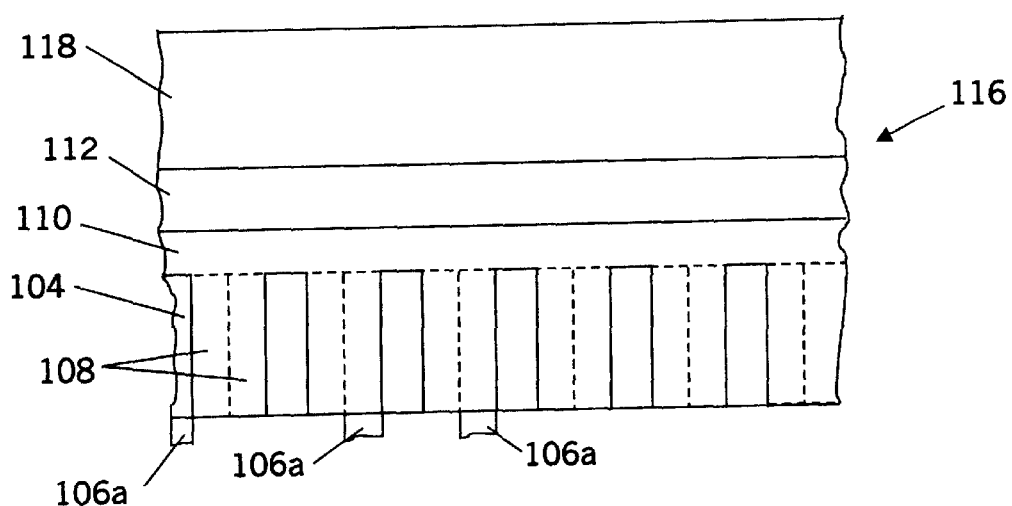

Finally, referring to FIG. 6, the gallium nitride semiconductor layer 110 is separated from the substrate 102 at the weak posts to produce a freestanding gallium nitride semiconductor structure 116. As shown in FIG. 6, the gallium nitride structure preferably includes a freestanding monocrystalline gallium nitride substrate, that is formed by layers 110 and/or 112 that has first and second opposing faces and a defect density of less than $10^5$ cm$^{-3}$. The faces of the freestanding monocrystalline gallium nitride substrate preferably have an area greater than 0.25 cm$^2$ and a thickness of at least 30 μm. As shown in FIG. 6, at least one remnant 106a of the posts 106 extend from one of the faces. Due to the cracking and/or shearing, the post remnants 106a may have jagged ends.

It will be understood that the substrate may be removed using standard chemical and/or mechanical processes resulting in the fabrication of the freestanding gallium nitride structure 116. The gallium nitride structure 116 of low defect density then may be used as a seed substrate for further growth of low defect gallium nitride thereon. Thus, a second epitaxial layer 118 may be formed on the gallium nitride semiconductor layer 110 or on the first gallium nitride epitaxial layer 112. The size of the freestanding low defect gallium nitride structure 116 may be limited only by the size of the initial substrate platform 102. Thus, large area freestanding gallium nitride substrates may be provided.

Figure 7:
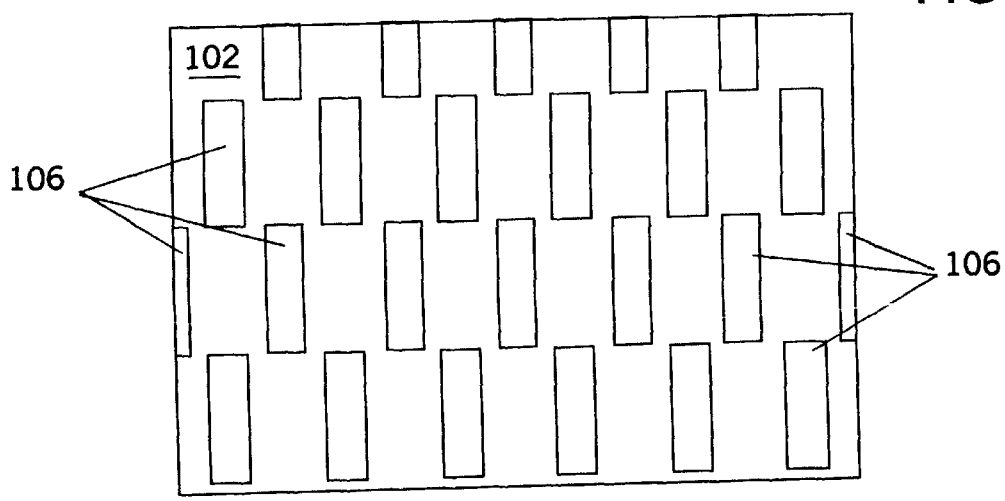
FIGS. 7 and 8 are top views of alternate embodiments of weak posts according to the present invention.

FIG. 7 is a top view of alternate embodiments of weak posts according to the present invention. As shown in FIG.

7, the posts may be weakened by forming an array of staggered posts 106 on the substrate 102, rather than forming long rows of continuous posts. It will be understood by those having skill in the art that staggering may be provided as an alternative to or in addition to providing the narrow posts of FIGS. 1–6.

Figure 8:
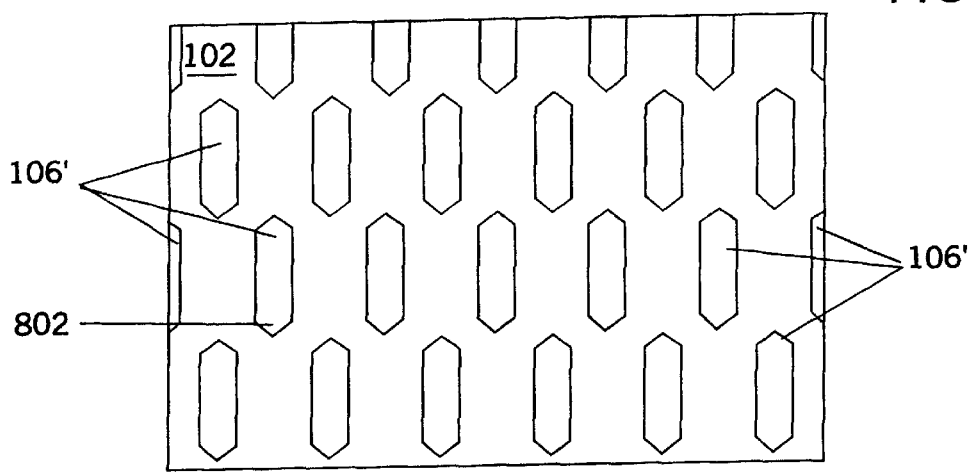

FIG. 8 is a top view of another alternate embodiment, wherein staggered posts 106' include tips 802 on the ends thereof. The tips 802 can reduce stresses during pendeoepitaxial growth therefrom.

FIGS. 9–14 illustrate other embodiments according to the present invention.

In general, FIGS. 9–14 illustrate forming post weakening regions in the posts, adjacent the substrate, preferably by implanting ions such as hydrogen ions in the posts. The hydrogen agglomerate to form bubbles which can then crack the post weakening regions upon cooling. The implantation of ions into a surface to promote wafer bonding and/or wafer splitting is described, for example, in U.S. Pat. No. 5,710,057 to Kenney entitled *SOI Fabrication Method* and U.S. Pat. No. 5,877,070 to Goesele et al. entitled *Method for the Transfer of Thin Layers of Monocrystalline Material to a Desirable Substrate*. However, it will be understood that other methods of weakening the posts including implantation of various ions, selective etching of areas of the posts and/or other techniques may be used to form the post weakening region in the posts.

Figure 9:
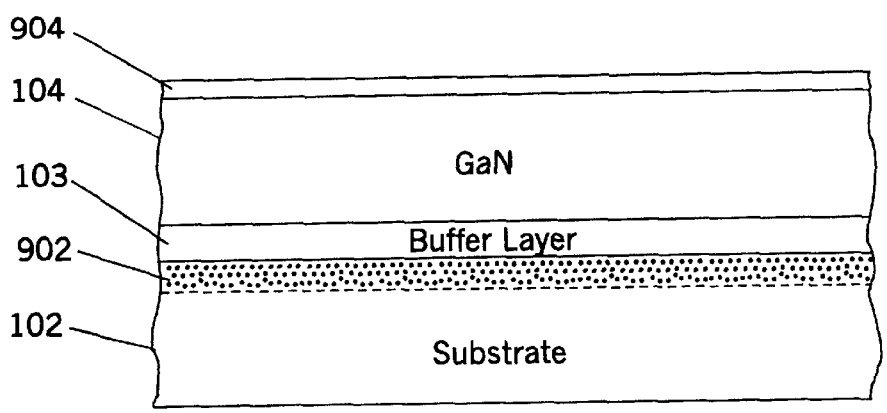
FIGS. 9–14 are cross-sectional views of other gallium nitride semiconductor structures during intermediate fabrication steps, according to the present invention.

More specifically, referring now to FIG. 9, an underlying gallium nitride layer 104 is formed on a substrate 102 including an intermediate buffer layer 103 as was described above in connection with FIG. 1. However, in FIG. 9, ions 902, preferably hydrogen ions, are implanted into the substrate 102. The ions may be implanted into the substrate 102 using conventional techniques. As also shown in FIG. 9, an optional first mask 904 is formed on the underlying gallium nitride layer 104 opposite the buffer layer 103. As will be described below, this mask may reduce and preferably prevent gallium nitride nucleation and growth from the tops of the posts during pendeoepitaxy.

Figure 10:
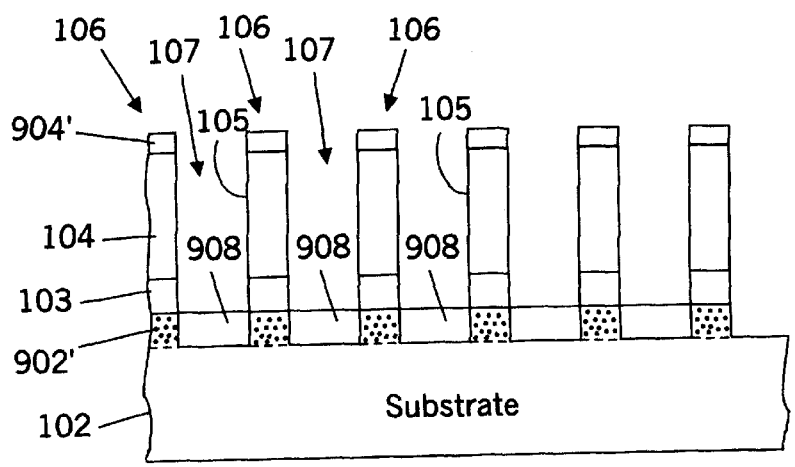

Then, referring to FIG. 10, the weak posts are formed by etching through the mask 904, at least partly through the gallium nitride layer 104, optionally at least partly through the buffer layer 103 and optionally at least partly through the substrate 102. As shown, the first mask 904 forms a cap 904' on the posts 106. As also shown in FIG. 10, an optional second mask 908 may be formed the floors of the trenches 107. The second mask 908 may reduce and preferably prevent nucleation and growth of gallium nitride from the trench floors during pendeoepitaxy. It will be understood that masks 904' and 908 may be formed simultaneously, and preferably comprise the same material, such as silicon dioxide, silicon nitride and/or metal. However, they may be formed separately, and may comprise different materials.

For example, line-of-sight deposition techniques, such as thermal evaporation or electron beam evaporation of mask materials such as silicon dioxide, silicon nitride and/or metal such as tungsten may be used. If the mask material is deposited after the etching step, it covers only the vertical surfaces, i.e. the top surfaces of the posts 106 and the bottom surfaces (floors) of the trenches 107. Gallium nitride preferably nucleates little, if at all, on the masks 904' and 908, so that gallium nitride preferably only grows from the sidewalls 105 of the posts during pendeoepitaxy. Alternatively, the masks 904' and 908 may comprise different materials and/or be of different thicknesses. It also will be understood that one or both of the masks need not be formed, and one or both of the masks also may be used in the embodiments of FIGS. 1–8.

As shown in FIG. 10, each post has a weakened region 902' that is formed by the ion implantation step. Although the weakened region 902' is shown in the substrate 102, it also or alternatively may be present in the buffer layer 103 and/or in the gallium nitride layer 104 that form the posts 106.

Figure 11:
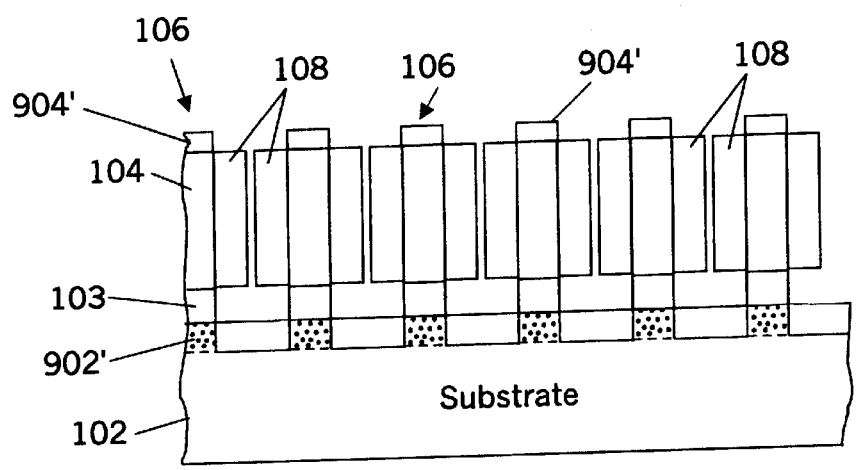
Figure 12:
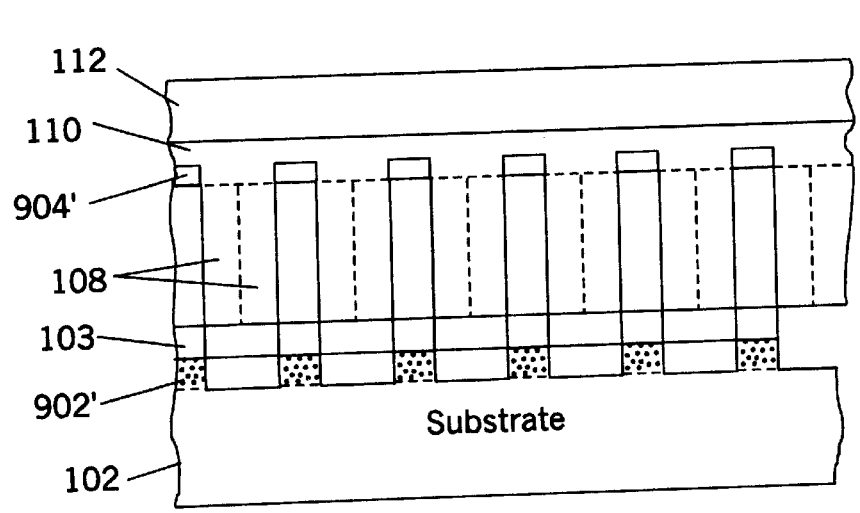

Referring now to FIG. 11, pendeoepitaxy is performed as was described in connection with FIG. 3. It also will be understood that the gallium nitride layer may grow from the sidewalls directly on the mask 908 without leaving a gap therebetween. Then, as shown in FIG. 12, the gallium nitride semiconductor layer 110 and the optional first epitaxial layer 112 are formed as was described above in connection with FIG. 4.

Figure 13:
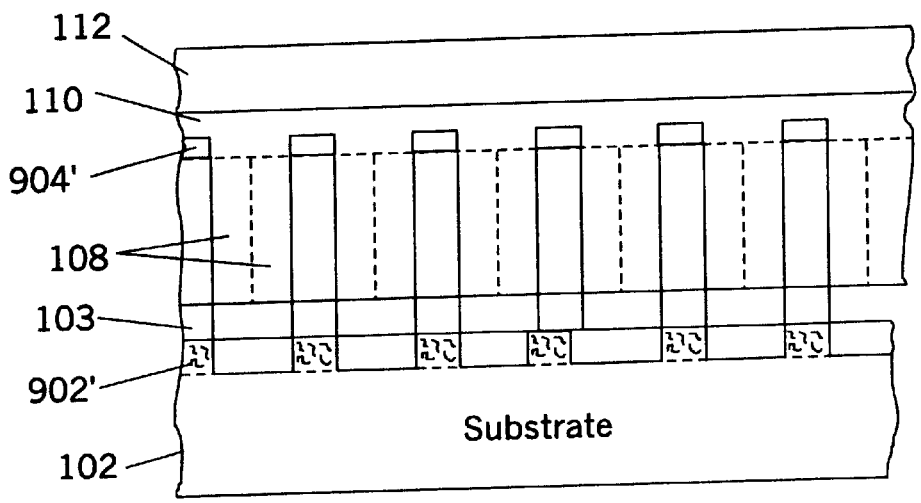

Referring now to FIG. 13, the elevated temperature at which the gallium nitride semiconductor layer 110 and the optional epitaxial gallium nitride layer 112 are formed then is reduced. The weakened area 902' of the weak posts 106 then crack due to the presence of the bubbles therein, to relieve stress in the gallium nitride semiconductor layer 110.

As shown in FIG. 13, preferably all of the posts 106 are cracked and/or sheared at the post weakening regions 902', because the implanted layer 902 was uniformly implanted into the substrate in FIG. 9. Alternatively, only some of the posts may be weakened or sheared, for example by selectively implanting the ions into the substrate 102.

Figure 14:
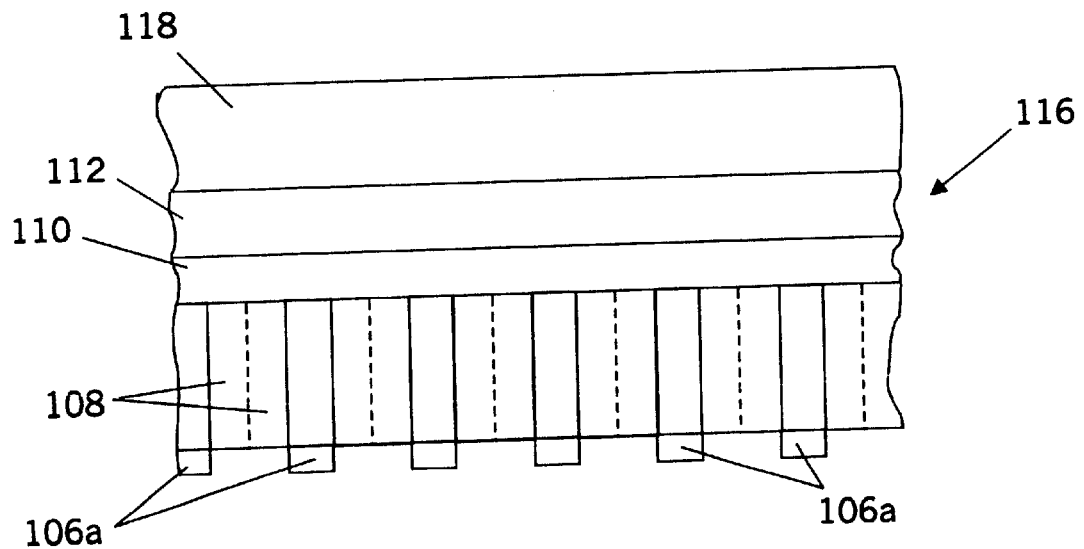

Finally, referring to FIG. 14, the substrate 102 is separated from the gallium nitride layers to produce a freestanding gallium nitride semiconductor structure 116, as was described in connection with FIG. 6. As was the case for FIG. 6, one or more posts 106a may extend from one of the faces of the structure. The posts in FIG. 14 may be smooth rather than jagged due to the results of the implantation.

It also will be understood that the post weakening regions 902" may be used in combination with or instead of the narrow posts of FIGS. 1–6 and/or the staggered posts of FIGS. 7 and 8. Accordingly, large area gallium nitride semiconductor substrates, preferably greater than 0.25 cm$^2$, may be fabricated with low defect densities, preferably less then 10$^5$ cm$^{-2}$ over the entire surface thereof. The area of the freestanding low defect density gallium nitride semiconductor layer may limited only by the size of the initial substrate platform that was used to support the processing.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a gallium nitride semiconductor layer comprising the steps of:

forming a plurality of weak posts on a substrate, the weak posts being configured to crack due to a thermal expansion coefficient mismatch between the substrate and a later formed gallium nitride semiconductor layer on the weak posts;

growing a gallium nitride layer from the weak posts at elevated temperature, until the gallium nitride layer coalesces to produce a gallium nitride semiconductor layer; and cracking at least some of the weak posts due to the thermal expansion coefficient mismatch between the substrate and the gallium nitride semiconductor layer upon reducing the elevated temperature, to thereby relieve stress in the gallium nitride semiconductor layer.

2. A method according to claim 1:
wherein the growing step comprises the step of pendeoepitaxially growing, at elevated temperature, a gallium nitride layer from sidewalls of the weak posts, that is cantilevered from the substrate, until the cantilevered gallium nitride layer coalesces to produce a gallium nitride semiconductor layer; and
wherein the cracking step comprises the step of cracking at least some of the weak posts between the substrate and the cantilevered gallium nitride layer due to the thermal expansion coefficient mismatch between the substrate and the gallium nitride semiconductor layer upon reducing the elevated temperature, to thereby relieve stress in the gallium nitride semiconductor layer.

3. A method according to claim 1 wherein the forming step comprises the step of forming an array of posts in spaced apart relation on the substrate.

4. A method according to claim 1 wherein the forming step comprises the step of forming a plurality of posts having a height-to-width ratio in excess of 0.5 on the substrate.

5. A method according to claim 1 wherein the forming step comprises the step of forming a post weakening region in the posts, adjacent the substrate.

6. A method according to claim 5 wherein the step of forming a post weakening region comprises the steps of:
forming a buried region in the substrate; and
selectively etching the substrate to define the plurality of weak posts including the post weakening regions that comprise the buried region, adjacent the substrate.

7. A method according to claim 6 wherein the step of forming a buried region comprises the step of implanting ions beneath the substrate surface.

8. A method according to claim 6 wherein the ions are hydrogen ions.

9. A method according to claim 1 wherein the step of cracking comprises the step of shearing at least some of the weak posts due to the thermal expansion coefficient mismatch between the substrate and the gallium nitride semiconductor layer upon reducing the elevated temperature, to thereby relieve stress in the gallium nitride semiconductor layer.

10. A method according to claim 1 wherein the step of cracking comprises the step of cracking all of the weak posts due to the thermal expansion coefficient mismatch between the substrate and the gallium nitride semiconductor layer upon reducing the elevated temperature, to thereby separate the gallium nitride semiconductor layer from the substrate and produce a freestanding gallium nitride semiconductor layer.

11. A method according to claim 1 wherein the cracking step is followed by the step of separating the gallium nitride semiconductor layer from the substrate at the weakened posts to produce a freestanding gallium nitride semiconductor layer.

12. A method according to claim 11 wherein the separating step is followed by the step of epitaxially growing a gallium nitride layer on the freestanding gallium nitride semiconductor layer.

13. A method according to claim 1 wherein the following step is performed between the steps of growing and cracking:
epitaxially growing a gallium nitride layer on the gallium nitride semiconductor layer.

14. A method of fabricating a gallium nitride semiconductor layer comprising the steps of:
forming an array of posts on a substrate in spaced apart relation;
growing a gallium nitride layer from the spaced apart posts at elevated temperature, until the gallium nitride layer coalesces to produce a gallium nitride semiconductor layer; and
reducing the elevated temperature.

15. A method according to claim 14 wherein the growing step comprises the step of pendeoepitaxially growing, at elevated temperature, a gallium nitride layer from sidewalls of the spaced apart posts, that is cantilevered from the substrate, until the cantilevered gallium nitride layer coalesces to produce a gallium nitride semiconductor layer.

16. A method according to claim 14 wherein the forming step comprises the step of forming a plurality of spaced apart posts having a height-to-width ratio in excess of 0.5 on the substrate.

17. A method according to claim 14 wherein the forming step comprises the step of forming a post weakening region in the spaced apart posts, adjacent the substrate.

18. A method according to claim 16 wherein the forming step comprises the step of forming a post weakening region in the spaced apart posts, adjacent the substrate.

19. A method according to claim 14 wherein the reducing step is followed by the step of separating the gallium nitride semiconductor layer from the substrate at the posts to produce a freestanding gallium nitride semiconductor layer.

20. A method according to claim 19 wherein the separating step is followed by the step of epitaxially growing a gallium nitride layer on the freestanding gallium nitride semiconductor layer.

21. A method according to claim 15 wherein the following step is performed between the steps of growing and reducing:
epitaxially growing a gallium nitride layer on the gallium nitride semiconductor layer.

22. A method of fabricating a gallium nitride semiconductor layer comprising the steps of:
forming a plurality of posts having a height-to-width ratio in excess of 0.5 on a substrate;
growing a gallium nitride layer from the posts having a height-to-width ratio in excess of 0.5 at elevated temperature, until the gallium nitride layer coalesces to produce a gallium nitride semiconductor layer; and
reducing the elevated temperature.

23. A method according to claim 22 wherein the growing step comprises the step of pendeoepitaxially growing, at elevated temperature, a gallium nitride layer from sidewalls of the posts having a height-to-width ratio in excess of 0.5, that is cantilevered from the substrate, until the cantilevered gallium nitride layer coalesces to produce a gallium nitride semiconductor layer.

24. A method according to claim 22 wherein the forming step comprises the step of forming a post weakening region in the posts having a height-to-width ratio in excess of 0.5, adjacent the substrate.

25. A method according to claim 22 wherein the reducing step is followed by the step of separating the gallium nitride semiconductor layer from the substrate at the posts to produce a freestanding gallium nitride semiconductor layer.

26. A method according to claim 25 wherein the separating step is followed by the step of epitaxially growing a gallium nitride layer on the freestanding gallium nitride semiconductor layer.

27. A method according to claim 22 wherein the following step is performed between the steps of growing and reducing:
  epitaxially growing a gallium nitride layer on the gallium nitride semiconductor layer.

28. A method of fabricating a gallium nitride semiconductor layer comprising the steps of:
  forming a plurality of posts on a substrate, the posts including therein a post weakening region adjacent the substrate;
  growing a gallium nitride layer from the weak posts at elevated temperature, until the gallium nitride layer coalesces to produce a gallium nitride semiconductor layer; and reducing the elevated temperature.

29. A method according to claim 28 wherein the growing step comprises the step of pendeoepitaxially growing, at elevated temperature, a gallium nitride layer from sidewalls of the posts including therein a post weakening region adjacent the substrate, that is cantilevered from the substrate, until the cantilevered gallium nitride layer coalesces to produce a gallium nitride semiconductor layer.

30. A method according to claim 28 wherein the forming step comprises the step of forming a plurality posts including therein a post weakening region adjacent the substrate and having a height-to-width ratio in excess of 0.5.

31. A method according to claim 28 wherein the step of forming comprises the steps of:
  forming a buried region in the substrate; and
  selectively etching the substrate to define the plurality of weak posts including the post weakening regions adjacent the substrate.

32. A method according to claim 31 wherein the step of forming a buried region comprises the step of implanting ions beneath the substrate surface.

33. A method according to claim 32 wherein the ions are hydrogen ions.

34. A method according to claim 28 wherein the reducing step is followed by the step of separating the gallium nitride semiconductor layer from the substrate at the post weakening regions to produce a freestanding gallium nitride semiconductor layer.

35. A method according to claim 34 wherein the separating step is followed by the step of epitaxially growing a gallium nitride layer on the freestanding gallium nitride semiconductor layer.

36. A method according to claim 28 wherein the following step is performed between the steps of growing and reducing:
  epitaxially growing a gallium nitride layer on the gallium nitride semiconductor layer.

37. A method of fabricating a gallium nitride semiconductor layer comprising the steps of:
  forming a plurality of posts on a substrate, the posts having a thermal expansion coefficient mismatch between the substrate and a later formed gallium nitride semiconductor layer on the posts;
  growing a gallium nitride layer from the posts at elevated temperature, until the gallium nitride layer coalesces to produce a gallium nitride semiconductor layer; and
  reducing the elevated temperature so as to crack at least some of the posts due to the thermal expansion coefficient mismatch between the substrate and the gallium nitride semiconductor layer.

38. A method according to claim 37:
  wherein the growing step comprises the step of pendeoepitaxially growing, at elevated temperature, a gallium nitride layer from sidewalls of the posts, that is cantilevered from the substrate, until the cantilevered gallium nitride layer coalesces to produce a gallium nitride semiconductor layer; and
  wherein the reducing step comprises the step of reducing the elevated temperature so as to crack at least some of the posts between the substrate and the cantilevered gallium nitride layer due to the thermal expansion coefficient mismatch between the substrate and the gallium nitride semiconductor layer.

39. A method according to claim 37 wherein the forming step comprises the step of forming an array of posts in spaced apart relation on the substrate.

40. A method according to claim 37 wherein the forming step comprises the step of forming a plurality of posts having a height-to-width ratio in excess of 0.5 on the substrate.

41. A method according to claim 37 wherein the forming step comprises the step of forming a post weakening region in the posts, adjacent the substrate.

42. A method according to claim 41 wherein the step of forming a post weakening region comprises the steps of:
  forming a buried region in the substrate; and
  selectively etching the substrate to define the plurality of posts including the post weakening regions that comprise the buried region, adjacent the substrate.

43. A method according to claim 42 wherein the step of forming a buried region comprises the step of implanting ions beneath the substrate surface.

44. A method according to claim 43 wherein the ions are hydrogen ions.

45. A method according to claim 37 wherein the step of reducing comprises the step of reducing the elevated temperature so as to shear at least some of the posts due to the thermal expansion coefficient mismatch between the substrate and the gallium nitride semiconductor layer.

46. A method according to claim 37 wherein the step of reducing comprises the step of reducing the elevated temperature so as to crack all of the posts due to the thermal expansion coefficient mismatch between the substrate and the gallium nitride semiconductor layer.

47. A method according to claim 37 wherein the reducing step is followed by the step of separating the gallium nitride semiconductor layer from the substrate at the cracked posts to produce a freestanding gallium nitride semiconductor layer.

48. A method according to claim 47 wherein the separating step is followed by the step of epitaxially growing a gallium nitride layer on the freestanding gallium nitride semiconductor layer.

49. A method according to 37 claim wherein the following step is performed between the steps of growing and reducing:
  epitaxially growing a gallium nitride layer on the gallium nitride semiconductor layer.

50. A method of fabricating a semiconductor layer comprising the steps of:
  forming a plurality of posts on a substrate, the posts being configured to crack due to a thermal expansion coefficient mismatch between the substrate and a later formed semiconductor layer on the posts;
  growing a layer from the posts at elevated temperature, until the layer coalesces to produce a semiconductor layer; and
  cracking at least some of the posts due to the thermal expansion coefficient mismatch between the substrate and the semiconductor layer upon reducing the elevated temperature, to thereby relieve stress in the semiconductor layer.

51. A method according to claim 44
wherein the growing step comprises the step of pendeoepitaxially growing, at elevated temperature, a layer from sidewalls of the posts, that is cantilevered from the substrate, until the cantilevered layer coalesces to produce a semiconductor layer; and
wherein the cracking step comprises the step of cracking at least some of the posts between the substrate and the cantilevered layer due to the thermal expansion coefficient mismatch between the substrate and the semiconductor layer upon reducing the elevated temperature, to thereby relieve stress in the semiconductor layer.

52. A method according to claim 44 wherein the forming step comprises the step of forming an array of posts in spaced apart relation on the substrate.

53. A method according to claim 44 wherein the forming step comprises the step of forming a plurality of posts having a height-to-width ratio in excess of 0.5 on the substrate.

54. A method according to claim 44 wherein the forming step comprises the step of forming a post weakening region in the posts, adjacent the substrate.

55. A method according to claim 48 wherein the step of forming a post weakening region comprises the steps of:
forming a buried region in the substrate; and
selectively etching the substrate to define the plurality of posts including the post weakening regions that comprise the buried region, adjacent the substrate.

56. A method according to claim 44 wherein the step of forming a buried region comprises the step of implanting ions beneath the substrate surface.

57. A method according to claim 44 wherein the ions are hydrogen ions.

58. A method according to claim 44 wherein the step of cracking comprises the step of shearing at least some of the posts due to the thermal expansion coefficient mismatch between the substrate and the semiconductor layer upon reducing the elevated temperature, to thereby relieve stress in the semiconductor layer.

59. A method according to claim 44 wherein the step of cracking comprises the step of cracking all of the posts due to the thermal expansion coefficient mismatch between the substrate and the semiconductor layer upon reducing the elevated temperature, to thereby separate the semiconductor layer from the substrate and produce a freestanding semiconductor layer.

60. A method according to claim 44 wherein the cracking step is followed by the step of separating the semiconductor layer from the substrate at the weakened posts to produce a freestanding semiconductor layer.

61. A method according to claim 54 wherein the separating step is followed by the step of epitaxially growing a layer on the freestanding semiconductor layer.

62. A method according to claim 44 wherein the following step is performed between the steps of growing and cracking:
epitaxially growing a layer on the semiconductor layer.

63. A method of fabricating a semiconductor layer comprising the steps of:
forming an array of posts on a substrate in spaced apart relation;
growing a layer from the spaced apart posts at elevated temperature, until the layer coalesces to produce a semiconductor layer; and
reducing the elevated temperature.

64. A method according to claim 57 wherein the growing step comprises the step of pendeoepitaxially growing, at elevated temperature, a layer from sidewalls of the spaced apart posts, that is cantilevered from the substrate, until the cantilevered layer coalesces to produce a semiconductor layer.

65. A method according to claim 57 wherein the forming step comprises the step of forming a plurality of spaced apart posts having a height-to-width ratio in excess of 0.5 on the substrate.

66. A method according to claim 57 wherein the forming step comprises the step of forming a post weakening region in the spaced apart posts, adjacent the substrate.

67. A method according to claim 59 wherein the forming step comprises the step of forming a post weakening region in the spaced apart posts, adjacent the substrate<

68. A method according to claim 57 wherein the reducing step is followed by the step of separating the semiconductor layer from the substrate at the posts to produce a freestanding semiconductor layer.

69. A method according to claim 62 wherein the separating step is followed by the step of epitaxially growing a layer on the freestanding semiconductor layer.

70. A method according to claim 58 wherein the following step is performed between the steps of growing and reducing:
epitaxially growing a layer on the semiconductor layer.

71. A method of fabricating a semiconductor layer comprising the steps of:
forming a plurality of posts having a height-to-width ratio in excess of 0.5 on a substrate;
growing a layer from the posts having a height-to-width ratio in excess of 0.5 at elevated temperature, until the layer coalesces to produce a semiconductor layer; and
reducing the elevated temperature.

72. A method according to claim 65 wherein the growing step comprises the step of pendeoepitaxially growing, at elevated temperature, a layer from sidewalls of the posts having a height-to-width ratio in excess of 0.5, that is cantilevered from the substrate, until the cantilevered layer coalesces to produce a semiconductor layer.

73. A method according to claim 65 wherein the forming step comprises the step of forming a post weakening region in the posts having a height-to-width ratio in excess of 0.5, adjacent the substrate.

74. A method according to claim 65 wherein the reducing step is followed by the step of separating the semiconductor layer from the substrate at the posts to produce freestanding semiconductor layer.

75. A method according to claim 68 wherein the separating step is followed by the step of epitaxially growing a layer on the freestanding semiconductor layer.

76. A method according to claim 65 wherein the following step is performed between the steps of growing and reducing:
epitaxially growing a layer on the semiconductor layer.

77. A method of fabricating a semiconductor layer comprising the steps of:
forming a plurality of posts on a substrate, the posts including therein a post weakening region adjacent the substrate;
growing a layer from the posts at elevated temperature, until the layer coalesces to produce a semiconductor layer; and
reducing the elevated temperature.

78. A method according to claim 71 wherein the growing step comprises the step of pendeoepitaxially growing, at elevated temperature, a layer from sidewalls of the posts including therein a post weakening region adjacent the substrate, that is cantilevered from the substrate, until the cantilevered layer coalesces to produce a semiconductor layer.

79. A method according to claim 71 wherein the forming step comprises the step of forming a plurality posts including therein a post weakening region adjacent the substrate and having a height-to-width ratio in excess of 0.5.

80. A method according to claim 71 wherein the step of forming comprises the steps of:

forming a buried region in the substrate; and selectively etching the substrate to define the plurality of posts including the post weakening regions adjacent the substrate.

81. A method according to claim 74 wherein the step of forming a buried region comprises the step of implanting ions beneath the substrate surface.

82. A method according to claim 75 wherein the ions are hydrogen ions.

83. A method according to claim 71 wherein the reducing step is followed by the step of separating the semiconductor layer from the substrate at the post weakening regions to produce a freestanding semiconductor layer.

84. A method according to claim 77 wherein the separating step is followed by the step of epitaxially growing a layer on the freestanding semiconductor layer.

85. A method according to claim 71 wherein the following step is performed between the steps of growing and reducing:

epitaxially growing a layer on the semiconductor layer.

* * * * *

UNITED STATES PATENT AND TRADEMARK OFFICE
CERTIFICATE OF CORRECTION

PATENT NO. : 6,380,108 B1
DATED : April 30, 2002
INVENTOR(S) : Linthicum, Kevin J.

It is certified that error appears in the above-identified patent and that said Letters Patent is hereby corrected as shown below:

Column 13,
Claims 51, 52, 53, 54, 58, 59, 60 and 62, please delete "44" and insert -- 50 --.
Claim 55, please delete "48" and insert -- 54 --.
Claim 56 and 57, please delete "44" and insert -- 55 --.
Claim 61, please delete "54" and insert -- 60 --.
Claim 64, please delete "57" and insert -- 63 --.

Column 14,
Claims 65, 66 and 68, please delete "57" and insert -- 63 --.
Claim 67, please delete "59" and insert -- 65 -- and delete the < at the end of the claim and insert -- . --
Claim 69, please delete "62" and insert -- 68 --.
Claim 70, please delete "58" and insert -- 64 --.
Claims 72, 73, 74 and 76, please delete "65" and insert -- 71 --.
Claim 74, line 47, please add -- a -- after the word "produce".
Claim 75, please delete "68" and insert -- 74 --.
Claim 78, please delete "71" and insert -- 77 --.

Column 15,
Claims 79 and 80, please delete "71" and insert -- 77 --.
Line 6, please add -- of -- after the word "plurality".
Claim 81, please delete "74" and insert -- 80 --.

UNITED STATES PATENT AND TRADEMARK OFFICE
CERTIFICATE OF CORRECTION

PATENT NO.      : 6,380,108 B1
DATED           : April 30, 2002
INVENTOR(S)     : Linthicum, Kevin J.

It is certified that error appears in the above-identified patent and that said Letters Patent is hereby corrected as shown below:

Column 16,
Claim 82, please delete "75" and insert -- 81 --.
Claims 83 and 85, please delete "71" and insert -- 77 --.
Claims 84, please delete "77" and insert -- 83 --.

Signed and Sealed this

Thirtieth Day of July, 2002

Attest:

Attesting Officer

JAMES E. ROGAN
Director of the United States Patent and Trademark Office